United States Patent
Wang et al.

(10) Patent No.: US 12,317,491 B2
(45) Date of Patent: May 27, 2025

(54) THREE-DIMENSIONAL MEMORY DEVICE AND FABRICATION METHOD FOR ENHANCED RELIABILITY

(71) Applicant: Yangtze Memory Technologies Co., Ltd., Wuhan (CN)

(72) Inventors: Qiguang Wang, Wuhan (CN); Hao Pu, Wuhan (CN); Jinhao Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 494 days.

(21) Appl. No.: 17/456,751

(22) Filed: Nov. 29, 2021

(65) Prior Publication Data
US 2023/0139782 A1 May 4, 2023

Related U.S. Application Data

(63) Continuation of application No. PCT/CN2021/128315, filed on Nov. 3, 2021.

(51) Int. Cl.
| | |
|---|---|
| H01L 21/00 | (2006.01) |
| H01L 21/30 | (2006.01) |
| H10B 41/27 | (2023.01) |
| H10B 43/27 | (2023.01) |

(52) U.S. Cl.
CPC ......... H10B 43/27 (2023.02); H01L 21/3003 (2013.01); H10B 41/27 (2023.02)

(58) Field of Classification Search
CPC ...... H10B 43/27; H10B 41/27; H01L 21/3003
See application file for complete search history.

(56) References Cited

U.S. PATENT DOCUMENTS

| | | | |
|---|---|---|---|
| 7,278,001 B2* | 10/2007 | Oshima | G11C 16/102 711/E12.008 |
| 2016/0118391 A1* | 4/2016 | Zhao | H01L 21/324 438/269 |
| 2021/0013303 A1 | 1/2021 | Chen et al. | |
| 2021/0109034 A1* | 4/2021 | Nie | G01N 21/956 |
| 2021/0280428 A1 | 9/2021 | Zhang et al. | |
| 2022/0262919 A1* | 8/2022 | Siddik | H01L 29/4234 |
| 2022/0302215 A1* | 9/2022 | Hu | H01L 21/02074 |

FOREIGN PATENT DOCUMENTS

| | | |
|---|---|---|
| CN | 111971795 A | 11/2020 |
| CN | 112074956 A | 12/2020 |
| WO | WO-9419829 * | 9/1994 |

* cited by examiner

*Primary Examiner* — Richard A Booth
(74) *Attorney, Agent, or Firm* — Anova Law Group, PLLC

(57) ABSTRACT

Three-dimensional (3D) NAND memory devices and methods are provided. In one aspect, a fabrication method includes forming a dielectric stack over a substrate, forming a functional layer and a semiconductor channel through the dielectric stack, forming a conductor/insulator stack based on the dielectric stack, and forming memory cells through the conductor/insulator stack. Each memory cell includes a portion of the functional layer and the semiconductor channel. At least one of the functional layer and the semiconductor channel includes a certain amount of deuterium elements.

20 Claims, 11 Drawing Sheets

THREE-DIMENSIONAL MEMORY DEVICE AND FABRICATION METHOD FOR ENHANCED RELIABILITY

CROSS-REFERENCE TO RELATED APPLICATION

This application claims the priority to PCT Patent Application No. PCT/CN2021/128315 filed on Nov. 3, 2021, the entire content of which is incorporated herein by reference.

FIELD OF THE TECHNOLOGY

This application relates to the field of semiconductor technology and, specifically, to a three-dimensional (3D) memory device and fabrication method for enhanced reliability.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

Memory cells of a 3D NAND device include a semiconductor channel and a tunneling layer. During the fabrication process, some defects typically form in the semiconductor channel, the tunneling layer, and the interface between the semiconductor channel and tunneling layer. The defects are then fixed by hydrogen passivation. Hydrogen passivated bonds, however, can break at elevated temperatures or under electric stress. The broken bonds reactivate some defects and cause reliability issues.

SUMMARY

In one aspect of the present disclosure, a method for fabricating a 3D memory device includes providing a substrate for the 3D memory device, forming a dielectric stack over a top surface of the substrate, forming a channel hole through the dielectric stack, forming a blocking layer on a sidewall of the channel hole, forming a charge trap layer on a surface of the blocking layer, forming a tunneling layer on a surface of the charge trap layer, forming a semiconductor channel on a surface of the tunneling layer, forming a conductor/insulator stack based on the dielectric stack, and forming memory cells through the conductor/insulator stack. Each memory cell includes a portion of the blocking layer, the charge trap layer, the tunneling layer, and the semiconductor channel. At least one of the blocking layer, the charge trap layer, the tunneling layer, and the semiconductor channel includes a certain amount of deuterium elements.

In another aspect of the present disclosure, a 3D memory device includes a substrate, a conductor/insulator stack formed over the substrate, a semiconductor channel extending through the conductor/insulator stack, a functional layer extending through the conductor/insulator stack and formed between the semiconductor channel and the conductor/insulator stack, and memory cells formed through the conductor/insulator stack. Each memory cell includes a portion of the functional layer and a portion of the semiconductor channel. The functional layer includes a blocking layer, a charge trap layer, and a tunneling layer. At least one of the blocking layer, the charge trap layer, the tunneling layer, and the semiconductor channel includes a certain amount of deuterium elements.

In another aspect of the present disclosure, a memory apparatus includes an input/output (I/O) component for receiving an input, a buffer for buffering a signal, a controller for implementing an operation, and a 3D memory device. The 3D memory device includes a substrate, a conductor/insulator stack formed over the substrate, a semiconductor channel extending through the conductor/insulator stack, and a functional layer extending through the conductor/insulator stack and formed between the semiconductor channel and the conductor/insulator stack. The functional layer includes a blocking layer, a charge trap layer, and a tunneling layer. At least one of the blocking layer, the charge trap layer, the tunneling layer, and the semiconductor channel includes a certain amount of deuterium elements.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1-12 schematically show a fabrication process of an exemplary 3D array device 100 according to aspects of the present disclosure. The 3D array device 100 is a part of a memory device and may also be referred to as a 3D memory structure. Among the figures, top views are in an X-Y plane and cross-sectional views are in a Y-Z plane or along a line in the X-Y plane.

Figure 1:
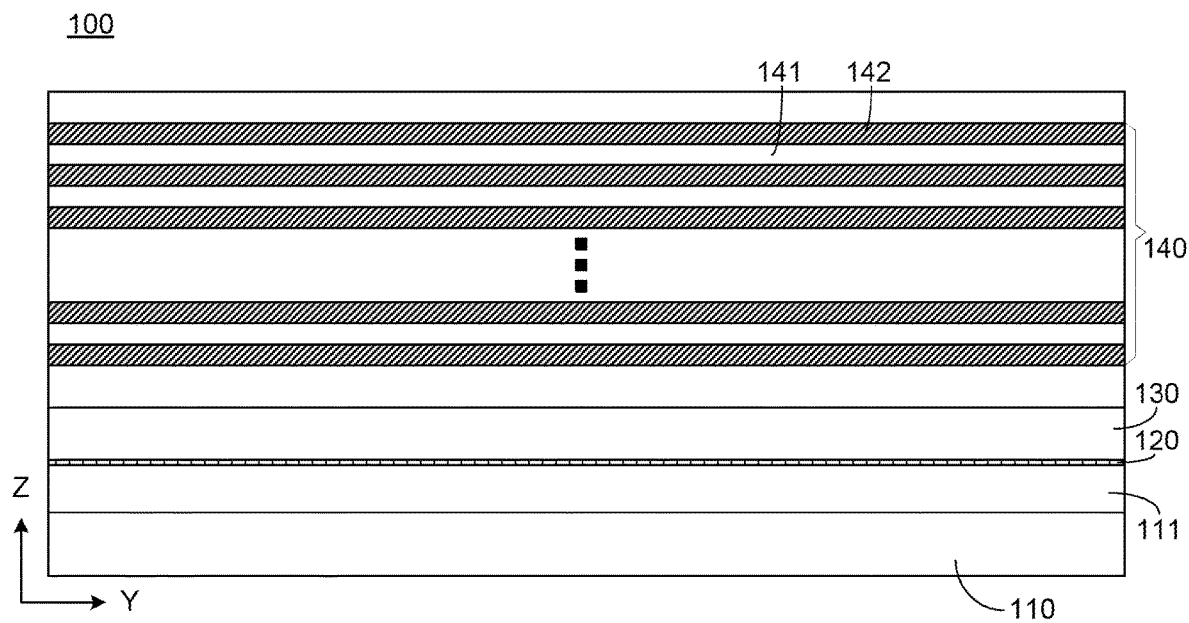
FIGS. 1 and 2 illustrate cross-sectional views of an exemplary three-dimensional (3D) array device at certain stages during a fabrication process according to various aspects of the present disclosure.

As shown in a cross-sectional view in FIG. 1, the 3D array device 100 includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a top portion of the substrate 110 is doped by n-type dopants via ion implantation and/or diffusion to form a doped region 111. The dopants of the doped region 111 may include, for example, phosphorus (P), arsenic (As), and/or antimony (Sb). As shown in FIG. 1, a cover layer 120 is deposited over the doped region 111. The cover layer 120 is a sacrificial layer and may include a single layer or a multilayer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. In some other aspects, the cover layer 120 may include another material such as aluminum oxide.

Further, over the cover layer 120, a sacrificial layer 130 is deposited. The sacrificial layer 130 may include a dielectric material, a semiconductor material, or a conductive material. The word "conductive", as used herein, indicates electrically conductive. An exemplary material for the sacrificial layer 130 is polysilicon.

After the polysilicon sacrificial layer 130 is formed, a dielectric stack 140 is formed. The dielectric stack 140 may be considered as a dielectric stack structure that includes multiple pairs of stack layers, for example, including first dielectric layers 141 and second dielectric layers 142, stacked alternately over each other. The dielectric stack may include 64 pairs, 128 pairs, or more than 128 pairs of the first and second dielectric layers 141 and 142.

In some aspects, the first dielectric layers 141 and the second dielectric layers 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductive stack layer. The first dielectric layers 141 and the second dielectric layers 142 may be deposited via CVD, PVD, ALD, or a combination thereof.

Figure 2:
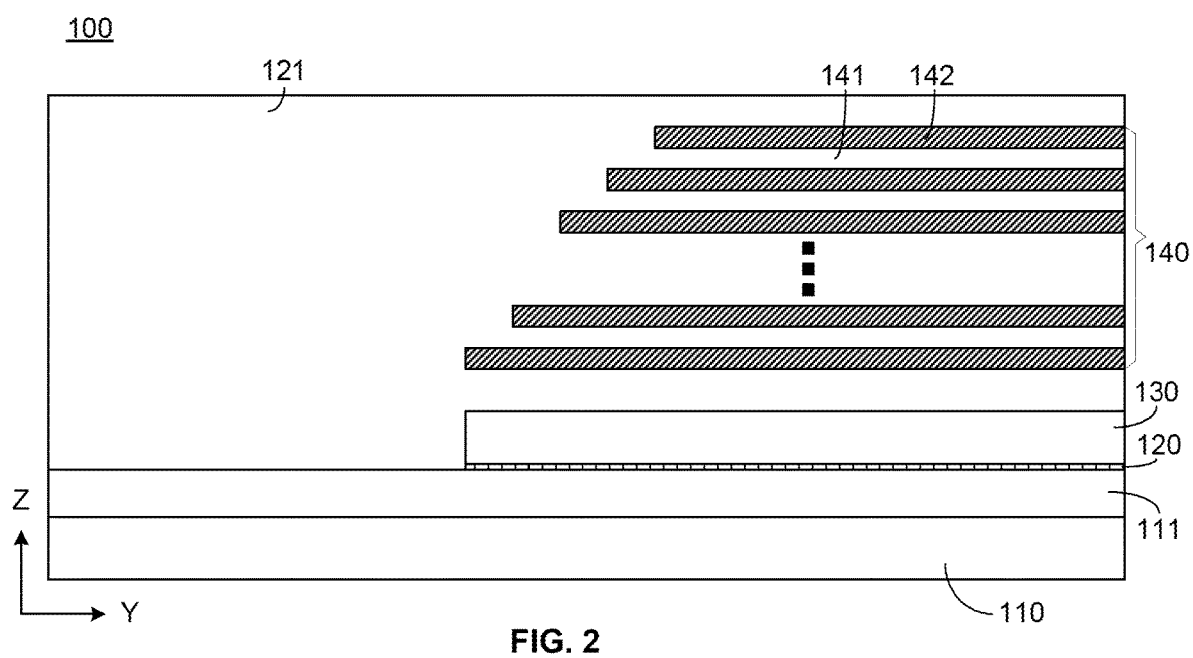

FIG. 2 shows a schematic cross-sectional view of the 3D array device 100 according to aspects of the present disclosure. As shown in FIG. 2, after the dielectric stack 140 is formed, a staircase formation process is performed to trim a part of the dielectric stack 140 into a staircase structure. Any suitable etching processes, including dry etch and/or wet etch process, may be used in the staircase formation process. For example, the height of the staircase structure may increase in a stepwise manner along the Y direction. A dielectric layer 121 is deposited to cover the staircase structure, the doped region 111, and the substrate 110. As shown in FIG. 2, the dielectric stack 140, the sacrificial layer 130, and the cover layer 120 are removed in a region on a side of the staircase structure, e.g., on the left side of the staircase structure. The region may be viewed as a contact region where through silicon contacts connected to contact pads may be configured or an opening for contact pads may be arranged. The word "connected" as used herein, indicates electrically connected. The contact region contains a portion of the dielectric layer 121 and thus is a dielectric region. In some aspects, the cover layer 120 is not etched away in the staircase formation process and a portion of the cover layer 120 may be buried under the dielectric layer 121 in the contact region.

Figure 3:
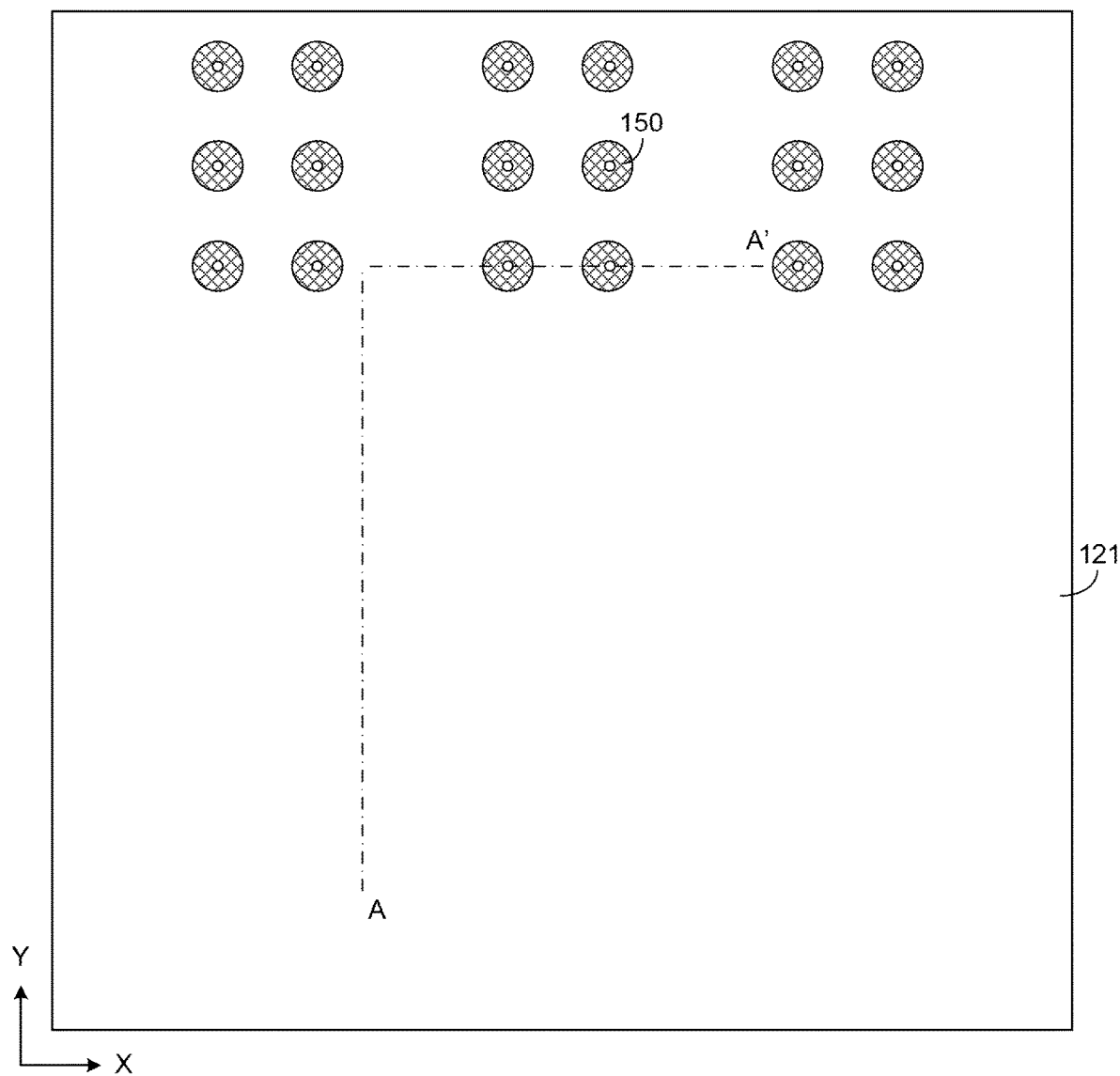
FIGS. 3 and 4 illustrate a top view and a cross-sectional view of the 3D array device shown in FIG. 2 after channel holes and functional layers are formed according to various aspects of the present disclosure.
Figure 4:
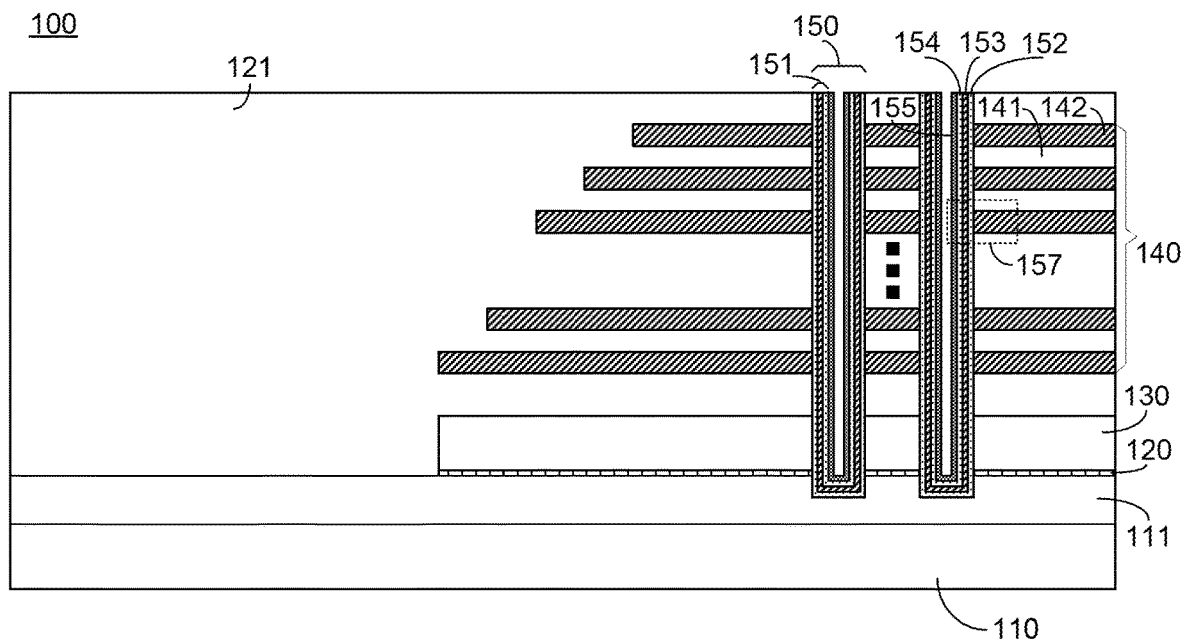
Figure 5A:
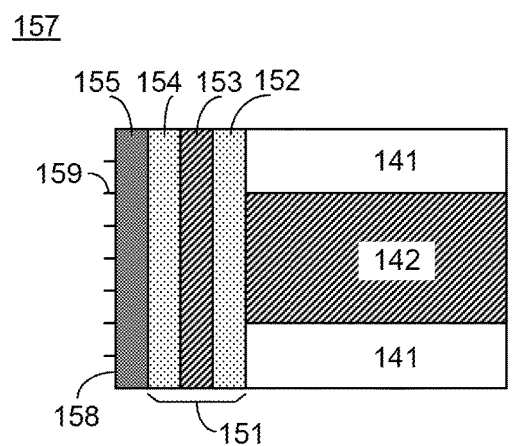
FIGS. 5A and 5B illustrates enlarged views of an exemplary portion of the 3D memory device shown in FIG. 4 according to various embodiments of the present disclosure.
Figure 5B:
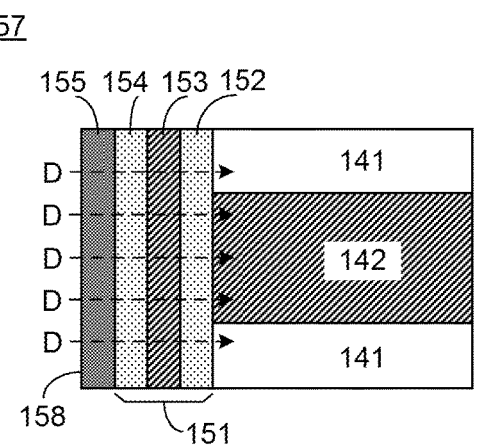

FIGS. 3 and 4 show a schematic top view and a schematic cross-sectional view of the 3D array device 100 after channel holes 150 are formed according to aspects of the present disclosure. FIGS. 5A and 5B illustrate enlarged views of a portion 157 of the 3D array device 100. The cross-sectional view shown in FIG. 4 is taken along a line AA' of FIG. 3. The quantity, dimension, and arrangement of the channel holes 150 shown in FIGS. 3 and 4 and in other figures in the present disclosure are exemplary and for description purposes, although any suitable quantity, dimension, and arrangement may be used for the disclosed 3D array device 100 according to various aspects of the present disclosure.

As shown in FIGS. 3 and 4, the channel holes 150 are arranged to extend in the Z direction or in a direction approximately perpendicular to the substrate 110 and form an array of a predetermined pattern (not shown) in the X-Y plane. The channel holes 150 may be formed by, for example, a dry etch process or a combination of dry and wet etch processes. Other processes may also be performed, such as a patterning process involving lithography, cleaning, and/or chemical mechanical polishing (CMP). The channel holes 150 may have a cylinder shape or pillar shape that extends through the dielectric stack 140, the sacrificial layer 130, the cover layer 120, and partially penetrates the doped region 111. After the channel holes 150 are formed, a functional layer 151 is deposited on the sidewall and bottom of the channel hole. The functional layer 151 includes a blocking layer 152 on the sidewall and bottom of the channel hole to block an outflow of charges, a charge trap layer 153 on a surface of the blocking layer 152 to store charges during an operation of the 3D array device 100, and a tunneling layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, a high-k dielectric material such as aluminum oxide or hafnium oxide, or another wide bandgap material. The tunneling layer 154 may include one or more layers that may include one or more materials. The material for the tunneling layer 154 may include silicon oxide, silicon nitride, silicon oxynitride, a high-k dielectric material such as aluminum oxide or hafnium oxide, or another wide bandgap material.

Further, a semiconductor channel 155 is deposited on a surface of the tunneling layer 154. The semiconductor channel 155 includes a polysilicon layer in some aspects. Optionally, the semiconductor channel 155 may include an amorphous silicon layer. Like the channel holes, the semiconductor channel 155 also extends through the dielectric stack 140 and into the doped region 111. The blocking layer 152, the charge trap layer 153, the tunneling layer 154, and the semiconductor channel 155 may be deposited by, e.g., CVD, PVD, ALD, or a combination of two or more of these processes. The structure formed in a channel hole 150, including the functional layer 151 and semiconductor channel 155, may be considered as a channel structure.

After the channel structure is made, some defects may appear on the surface of the semiconductor channel 155 and in the interface between the semiconductor channel 155 and the tunneling layer 154. Defects may also form in each layer of the channel structure and in the interfaces among layers 152-154. The defects on the surface of the semiconductor channel 155 include dangling bonds, which are caused by free radicals. The defects in the interfaces and layers include shallow traps that are electrically active. These defects may lead to charge leakage and threshold voltage shift of a memory cell in program state. During a hydrogen passivation process to repair the defects, atomic hydrogen binds to the defects (or defect states) to form complexes. The term "defect state" as used herein indicates an energy state of a defect. The word "complex" as used herein indicates a molecular entity that has two or more component molecular entities associated loosely. In a complex formed hydrogen passivation, component molecular entities include atomic hydrogen and a defect that are associated by a bond. The bond with atomic hydrogen in a complex, however, has relatively low bond energy. Consequently, the complex is not very stable and can dissociate when the bond breaks at elevated temperatures or high electric fields, which reactivates a defect and causes reliability issues.

To make a complex more stable, deuterium may be used to bind to a defect or defect state. Deuterium is an isotope of hydrogen with a nucleus consisting of one proton and one neutron. As the nucleus of ordinary hydrogen has one proton with no neutrons, the atomic mass of deuterium is roughly twice that of ordinary hydrogen. When atomic deuterium binds to a defect, the bond energy is higher than that between atomic hydrogen and the defect. As such, a complex formed by atomic deuterium is more stable than a complex formed by atomic hydrogen. Compared to passivation by hydrogen, the reliability may be enhanced when defects are cured by deuterium.

As used herein, the term "hydrogen element" indicates a pure substance consisting only of hydrogen, and the term "deuterium element" indicates a pure substance consisting only of deuterium. Hydrogen or deuterium elements include hydrogen or deuterium that is in the form of atoms or a part of a molecule. Additionally, the term "atomic hydrogen" indicates hydrogen that is in the form of single atoms and not a part of a molecule, and the term "atomic deuterium" indicates deuterium that is in the form of single atoms and not a part of a molecule.

As shown schematically in FIG. 5A, after the functional layer 151 and semiconductor channel 155 are fabricated, dangling bonds 159 appear on a surface 158 of the semiconductor channel 155. Other defects (not shown) are formed in the semiconductor channel 155 and layers 152-154 and interfaces between the layers. The defects (including the dangling bonds 159) may be repaired by passivation via atomic deuterium. In some aspects, a deuterium gas or a mixture of a deuterium gas and an inert gas (e.g., a nitrogen gas or argon gas) is used to provide atomic deuterium. The deuterium gas passes through the partially filled channel holes 150 (or the openings of the channel hole 150) to reach the surface 158. Then, atomic deuterium diffuses into the semiconductor channel 155 and layers 154, 153, and 152 sequentially at elevated temperatures, as illustrated in FIG. 5B. Atomic deuterium is represented by the letter "D" in FIG. 5B and other figures in the present disclosure. Consequently, atomic deuterium binds to defects to form complexes and cure the defects.

Optionally, ion implantation of deuterium may be performed to implant atomic deuterium in the region of the dielectric stack 140, followed by thermal diffusion to spread atomic deuterium. Defects in and around the semiconductor channels 155 and functional layers 151 may be passivated.

In some aspect, atomic deuterium may be provided to the layers 152-154 and the semiconductor channel 155 when the layers are deposited. For example, when the layers are grown by CVD, PVD, ALD, or a combination thereof, the gas source may include a gas that contains deuterium elements, such as $SiD_4$, $Si_2Cl_2D_2$, or $Si_2Cl_2D_4$. As the growth environment contains deuterium elements, some defects may be repaired by deuterium during fabrication. In some cases, defects mostly occur on the surface of the semiconductor channel 155 and in the interface between the semiconductor channel 155 and the tunneling layer 154. In such a case, the semiconductor channel 155 may be grown using a gas source containing deuterium elements, while the layers 152-154 may be grown without using a gas source containing deuterium elements.

As defects may form in the interfaces and layers, the semiconductor channel 155 and layers 152-154 each may contain a certain number of complexes that have a deuterium element after passivation by deuterium. In other words, the semiconductor channel 155 and layers 152-154 each may contain a certain amount of the deuterium elements after passivation by deuterium. Since atomic hydrogen is not involved in the passivation process, in some cases, the semiconductor channel 155 and layers 152-154 do not contain complexes that have a hydrogen element binding to a defect or defect state after passivation by deuterium.

Figure 6:
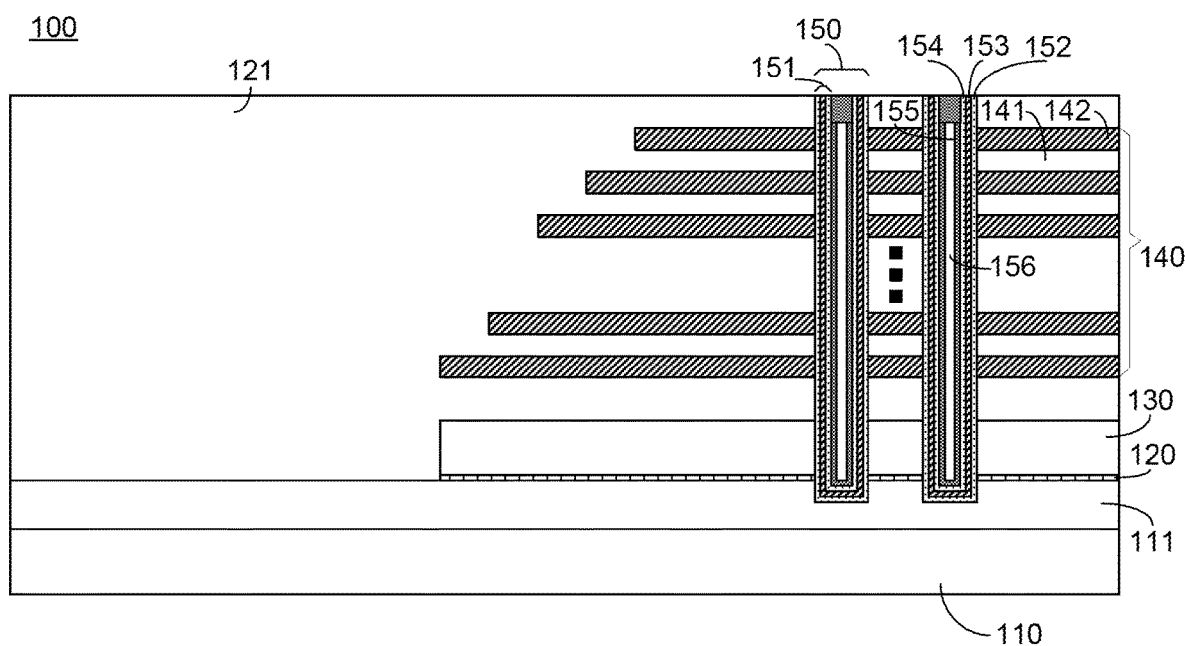
FIG. 6 illustrates a cross-sectional view of the 3D array device shown in FIGS. 3 and 4 after the channel holes are filled according to various aspects of the present disclosure.

After the semiconductor channel 155 is formed or after the semiconductor channel 155 is formed and passivation with deuterium is performed, the opening of the channel hole 150 is filled by an oxide material 156, as shown in FIG. 6. Optionally, ion implantation of deuterium may be conducted after filling the opening of the channel hole 150 with the oxide material 156, followed by an annealing process for diffusion of atomic deuterium and passivation of defects.

In some cases, the functional layer 151 includes an oxide-nitride-oxide (ONO) structure. That is, the blocking layer 152 is a silicon oxide layer, the charge trap layer 153 is a silicon nitride layer, and the tunneling layer 154 is another silicon oxide layer.

Optionally, the functional layer 151 may have a structure different from the ONO configuration. In the following descriptions, the ONO structure is used exemplarily for the blocking layer 152, the charge trap layer 153, and the tunneling layer 154.

Referring to FIG. 6, the channel holes 150 are etched after the staircase structure is formed. Optionally, the channel holes 150 may also be formed before the staircase formation process. For example, after the dielectric stack 140 is fabricated as shown in FIG. 1, the channel holes 150 may be formed and then the functional layer 151 and semiconductor channel 155 may be deposited. After the channel holes 150 are filled with the oxide material 156, the staircase formation process may be performed to form the staircase structure.

Figure 7:
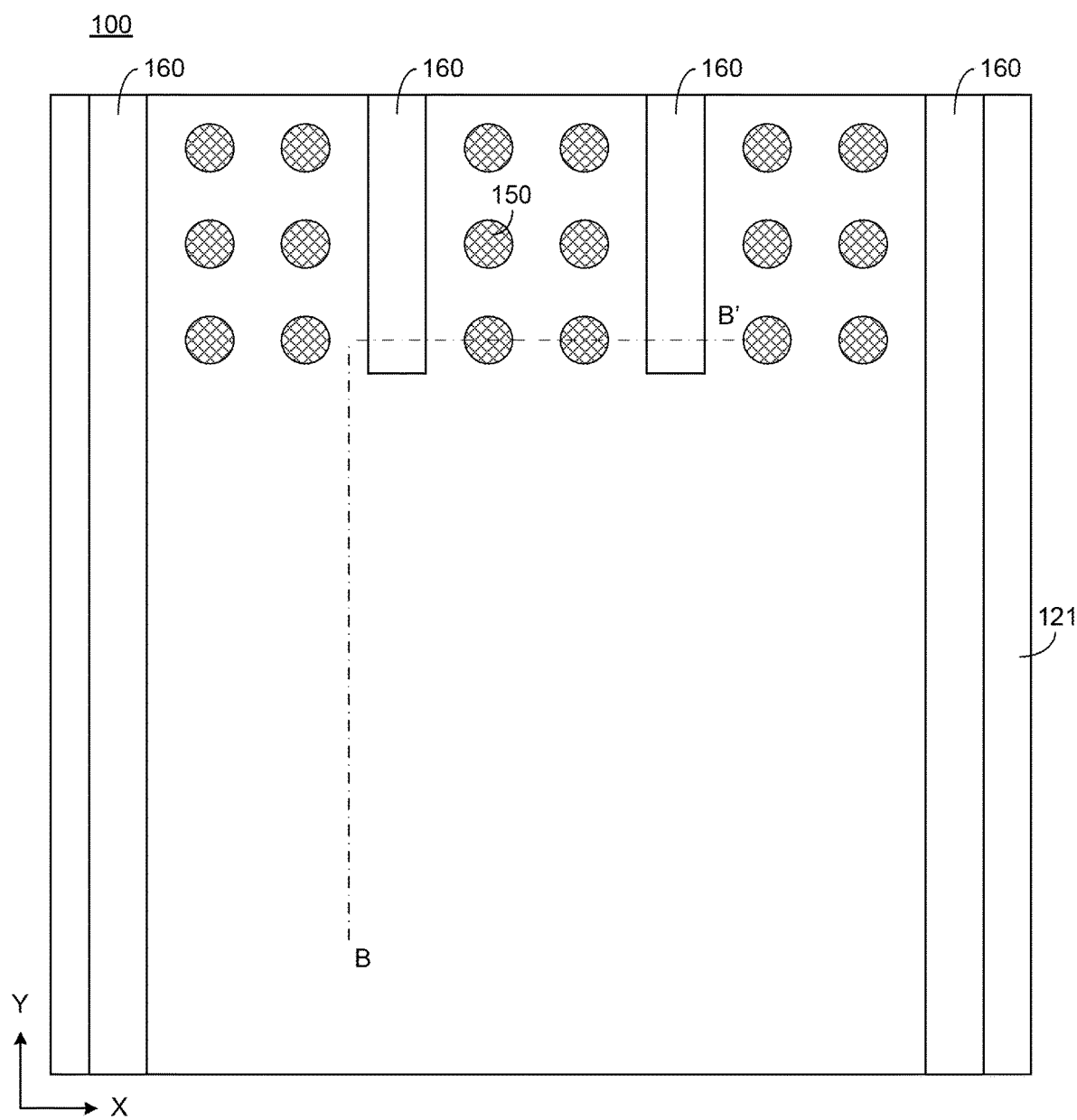
FIGS. 7 and 8 illustrate a top view and a cross-sectional view of the 3D array device shown in FIG. 6 after gate line slits are formed according to various aspects of the present disclosure.
Figure 8:
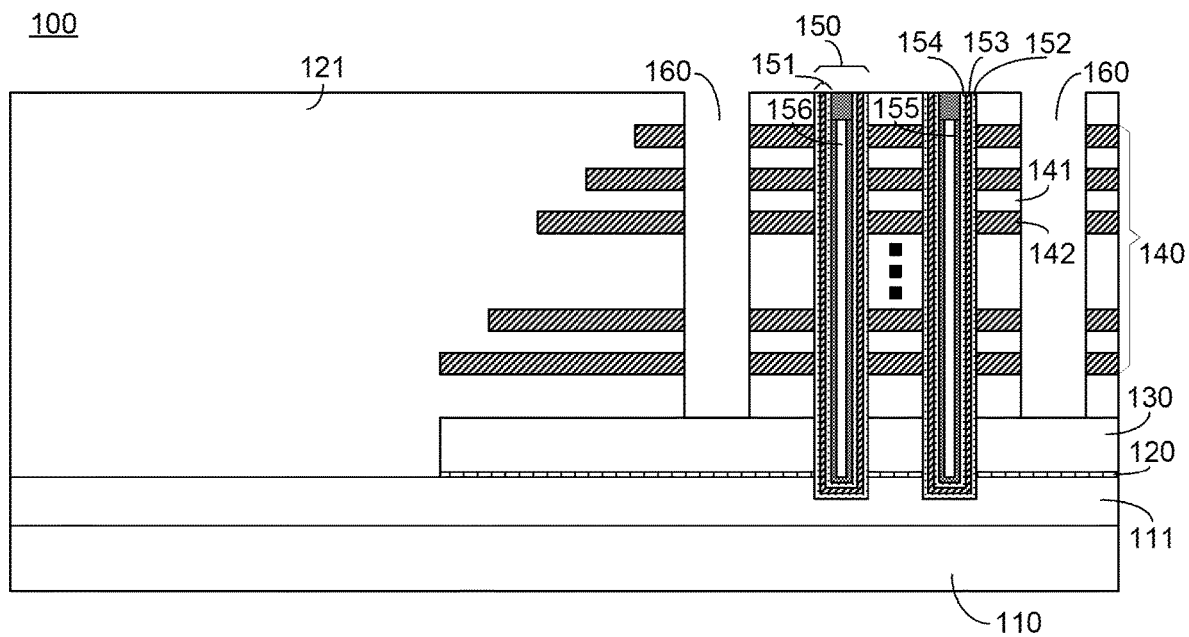

FIGS. 7 and 8 show a schematic top view and a schematic cross-sectional view of the 3D array device 100 after gate line slits 160 are formed according to aspects of the present disclosure. The cross-sectional view shown in FIG. 8 is taken along a line BB' of FIG. 7. A gate line slit may also be referred to as a gate line slit structure. The 3D array device 100 has a great number of channel holes 150 arranged in memory planes (not shown). Each memory plane is divided into memory blocks (not shown) and memory fingers by the gate line slits. For example, the configuration of the channel holes 150 as shown in FIG. 7 reflects memory fingers between the gate line slits 160.

The gate line slits 160 may be formed by, for example, a dry etch process or a combination of dry and wet etch processes. As shown in FIGS. 7 and 8, the gate line slits 160 extend, e.g., in the X and Y directions horizontally, and extend through the dielectric stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slit 160 by CVD, PVD, ALD, or a combination thereof. The spacer layers are configured to protect the first and second dielectric layers 141 and 142 and may include, for example, silicon oxide and silicon nitride.

After the spacer layers are deposited, selective etching is performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, is performed to remove the sacrificial layer 130. Removal of the sacrificial layer 130 creates a cavity and exposes the cover layer 120 and bottom portions of the blocking layers 152 formed in the channel holes 150. Further, multiple selective etch processes, e.g., multiple selective wet etch processes, are performed to remove the exposed portions of the blocking layer 152, the charge trap layer 153, and the tunneling layer 154 consecutively, which exposes bottom side potions of the semiconductor channel 155.

When the cover layer 120 is silicon oxide and/or silicon nitride, the cover layer 120 may be removed when the bottom portions of the functional layers 151 are etched away. In certain aspects, the cover layer 120 includes a material other than silicon oxide or silicon nitride, and the cover layer 120 may be removed by one or more additional selective etch processes. Removal of the cover layer 120 exposes the top surface of the doped region 111.

After the etch processes, the doped region 111 and side portions of the semiconductor channel 155 close to the bottom of the channel hole 150 are exposed in the cavity left by etching away the sacrificial layer 130 and the cover layer 120. The cavity is filled by a semiconductor material, e.g., polysilicon, to form a semiconductor layer 131, e.g., by a CVD and/or ALD deposition process. The semiconductor layer 131 is n-doped, formed on the exposed surface of the doped region 111 and on sidewalls or side portions of the semiconductor channel 155, and connected to the doped region 111 and the semiconductor channel 155.

Optionally, a selective epitaxial growth is performed such that a layer of single crystalline silicon may be grown on the exposed surface of the doped region 111 and a polysilicon layer may be grown on the exposed surface of the semiconductor channel 155. Thus, the semiconductor layer 131 may include adjoined layers of single crystalline silicon and polysilicon.

Figure 9:
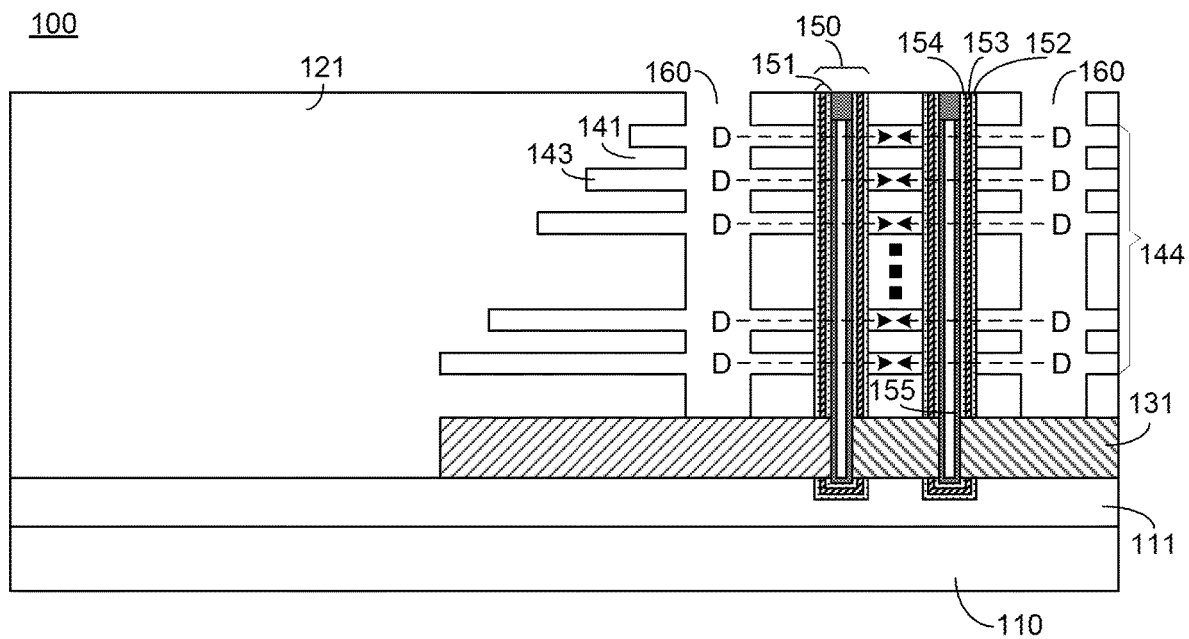
FIGS. 9, 10, and 11 illustrate cross-sectional views of the 3D array device shown in FIGS. 7 and 8 at certain stages in the fabrication process according to various aspects of the present disclosure.

When the bottom parts of the functional layer 151 and the cover layer 120 are etched, some spacer layers are etched away and the rest spacer layers remain on the sidewall of the gate line slits 160 to protect the first and second dielectric layers 141 and 142. After the semiconductor layer 131 is formed, the remaining spacer layers are removed in a selective etch process, e.g., a selective wet etch process, which exposes the sides of the second dielectric layer 142 around the gate line slits 160. In some aspects, the innermost spacer layer, which is in contact with the sidewall, is silicon nitride. Because the second dielectric layers 142 are also silicon nitride, the innermost spacer layer and the second dielectric layers 142 may be removed together during the etch process, leaving cavities 143 between the first dielectric layers 141, as shown in FIG. 9. As such, the dielectric stack 140 is changed into a dielectric stack 144.

Referring to FIG. 9, the cavity 143 exposes certain portions of the blocking layer 152. In some aspects, a deuterium gas or a mixture of a deuterium gas and an inert gas (e.g., a nitrogen gas or argon gas) may be transmitted to the exposed portions of the blocking layer 152. For example, the deuterium gas may flow to reach the exposed portions through the openings of the gate line slits 160 and cavities 143. Then, atomic deuterium diffuses into the layers 152-154 and semiconductor channel 155 sequentially at predetermined temperatures. During the passivation process, atomic deuterium repairs certain defects by forming complexes with the defects. As the deuterium gas fills the cavities 143, atomic deuterium also diffuses into the first dielectric layers 141 and cures defects of layers 141 by forming complexes. As such, there are complexes in portions of the layer 141 that are substantially proximate to the gate line slit 160 with respect to the semiconductor channel 155 or channel hole 150. The complex formed in the layer 141 contains atomic deuterium that binds to a defect or defect state.

Figure 10:
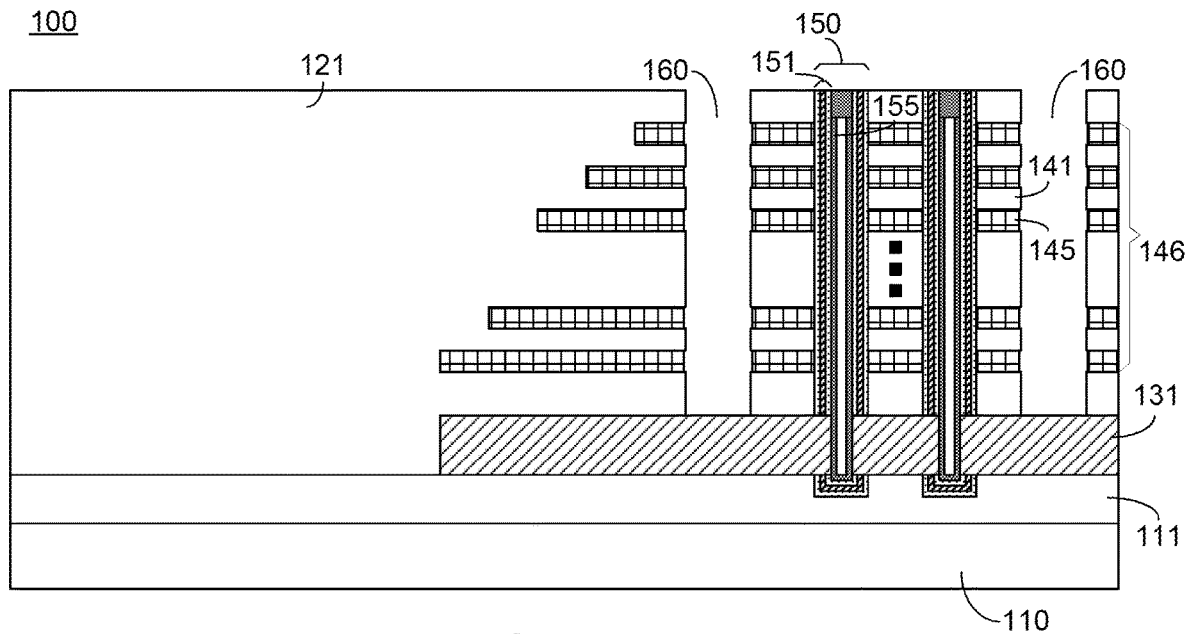

Further, a conductive material such as tungsten (W) is grown to fill the cavities 143 left by the removal of the second dielectric layers 142, forming conductive layers 145 between the first dielectric layers 141. After the conductive layers 145 are fabricated, the dielectric stack 144 is converted into a conductor/insulator stack 146, as shown in FIG. 10. The stack 146 may be considered as a conductor/insulator stack structure that includes the channel holes 150, functional layers 151, and semiconductor channels 155. The conductor/insulator stack 146 includes the first dielectric layers 141 and the conductive layers 145 that are alternatingly stacked over each other. In some aspects, before metal W is deposited in the cavities 143, a dielectric layer (not shown) of a high-k dielectric material such as aluminum oxide may be deposited. Optionally, the passivation process described above with respect to FIG. 9 may be performed after depositing the dielectric layer of a high-k dielectric material. Atomic deuterium may diffuse through the dielectric layer of the high-k dielectric material, the functional layer 151, and the semiconductor channel 155. Then, passivation by deuterium may begin. Thereafter, a layer of a conductive material such as titanium nitride (TiN) (not shown) is deposited. Further, metal W is deposited to form the conductive layers 145. CVD and/or ALD may be used in the deposition processes. Alternatively, another conductive material, such as cobalt (Co), copper (Cu), aluminum (Al), titanium (Ti), tantalum (Ta), tantalum nitride (TaN), doped silicon, or any combination thereof, may be used to form the conductive layers 145.

Referring to FIG. 10, a portion of each functional layer 151 in a channel hole 150 is between a portion of one of the conductive layers 145 and a portion of a semiconductor channel 155 in the channel hole 150. Each conductive layer 145 is configured to connect rows of NAND memory cells in an X-Y plane and is configured as a word line for the 3D array device 100. The semiconductor channel 155 formed in the channel hole 150 is configured to connect a column or a string of NAND memory cells along the Z direction and configured as a bit line for the 3D array device 100. As such, a portion of the functional layer 151 in the channel hole 150 in the X-Y plane, as a part of a NAND memory cell, is arranged between a conductive layer 145 and a semiconductor channel 155, i.e., between a word line and a bit line. The functional layer 151 may also be considered as disposed between the semiconductor channel 155 and the conductor/insulator stack 146. A portion of the conductive layer 145 that is around a portion of the channel hole 150 functions as a control gate or gate electrode for a NAND memory cell. The 3D array device 100 can be considered as including a 2D array of strings of NAND cells (such a string is also referred to as a "NAND string") in the stack 146 or the conductor/insulator stack structure. Each NAND string contains multiple NAND memory cells and extends vertically toward the substrate 110. The NAND strings form a 3D array of the NAND memory cells through the conductor/insulator stack 146 over the substrate 110.

Figure 11:
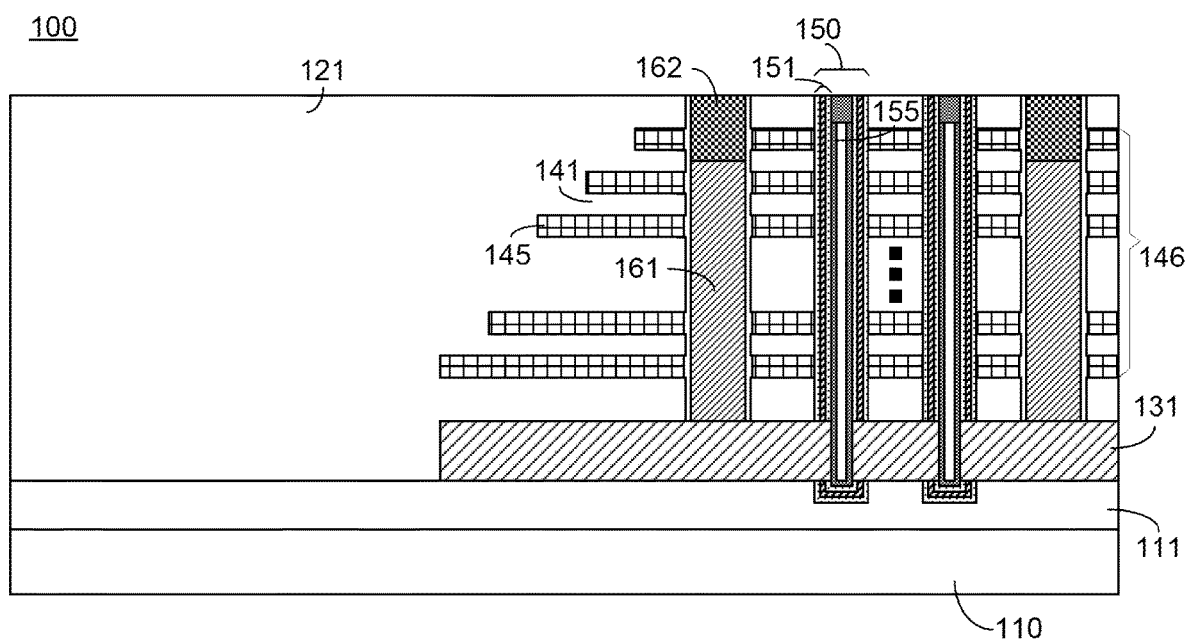

After the conductive layers 145 are grown in the cavities 143, a dielectric layer (e.g., a silicon oxide layer) may be deposited on the sidewalls and bottom surfaces of the gate line slits 160 by CVD, PVD, ALD, or a combination thereof. A dry etch process or a combination of dry etch and wet etch processes may be performed to remove the dielectric layer at the bottom of the gate line slits to expose parts of the semiconductor layer 131. The gate line slits are filled with a conductive material 161 (e.g., doped polysilicon) and a conductive plug 162 (e.g., metal W). The conductive material 161 in the gate line slit extends through the conductor/insulator stack 146 and contacts the semiconductor layer 131, as shown in FIG. 11. The word "contact" as a verb indicates electrically contacting an object as used herein. The filled gate line slits become an array common source for the 3D array device 100 in some aspects. Optionally, forming the array common source in the gate line slits includes depositing an insulation layer, a conductive layer (such as TiN, W, Co, Cu, or Al), and then a conductive material such as doped polysilicon.

Figure 12:
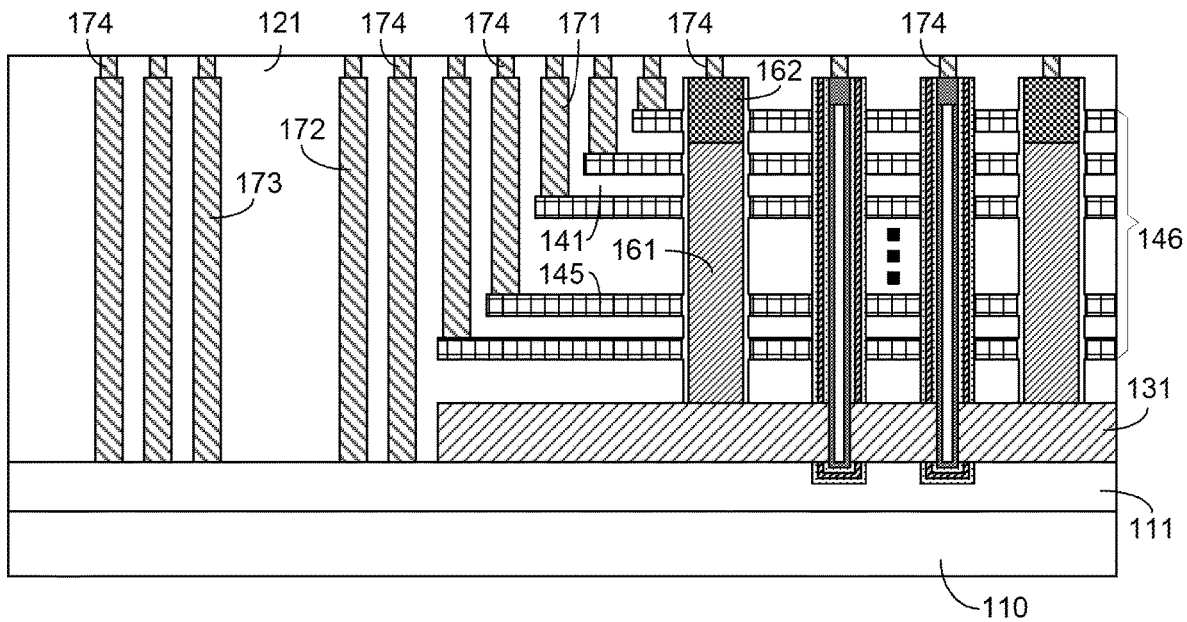
FIGS. 12 and 13 illustrate cross-sectional views of the 3D array device shown in FIG. 11 at certain stages in the fabrication process according to various aspects of the present disclosure.
Figure 13:
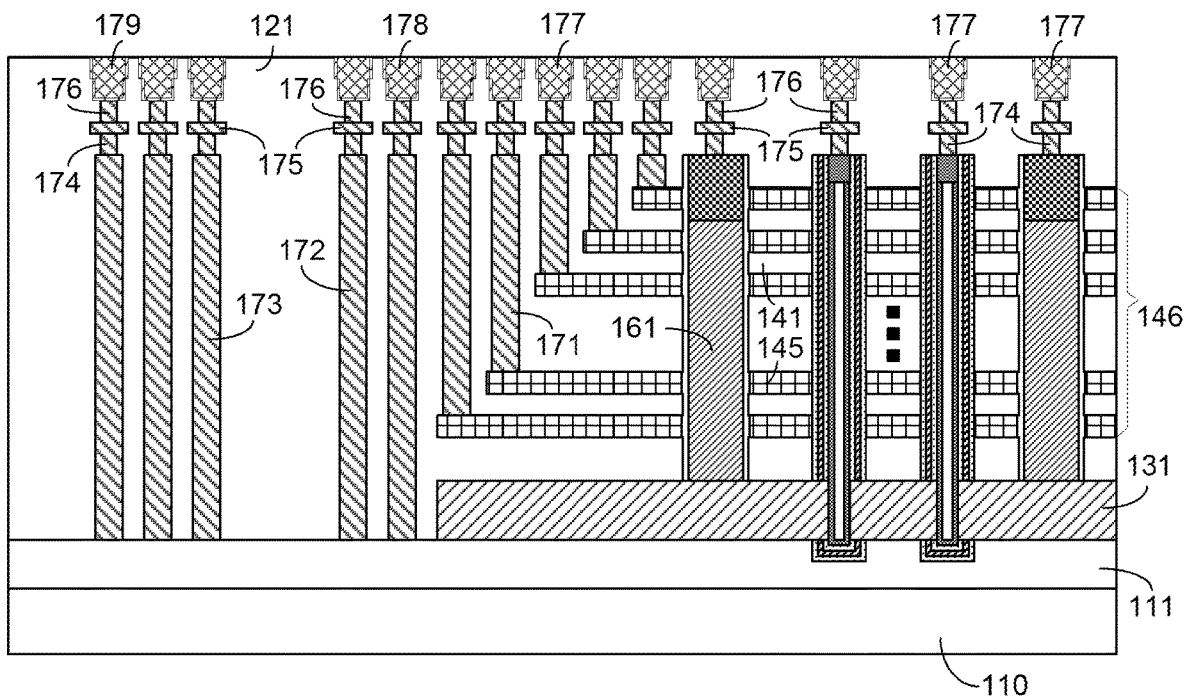

FIGS. 12 and 13 show schematic cross-sectional views of the 3D array device 100 at certain stages after contacts, vias, conductor layers, and connecting pads are formed according to aspects of the present disclosure. After the gate line slits 160 are filled and the array common source is formed as shown in FIG. 11, openings for word line contacts 171 and through silicon contacts 172 and 173 are formed respectively by, e.g., a dry etch process or a combination of dry and wet etch processes. The contacts 171-173 are arranged as interconnects for the 3D array device 100. The openings for the contacts 171-173 are respectively filled with a conductive material by CVD, PVD, ALD, electroplating, electroless plating, or any combination thereof. As shown in FIG. 12, the through silicon contacts 172 and 173 are formed in the contact region (i.e., a dielectric region) and beside the stack 146 and the NAND memory cells. The staircase structure is disposed between the contacts 172-173 and the stack 146, i.e., between the through silicon contacts 172-173 and the NAND memory cells. In some aspects, the contacts 172-173 extend to reach the doped region 111. Alternatively, the contacts 172-173 may extend to a level above the doped region 111 in the dielectric layer 121. The conductive material for the contacts 171-173 may include W, Co, Cu, Al, or a combination thereof. Optionally, a layer of a conductive material (e.g., TiN) may be deposited as a contact layer before another conductive material is deposited when the contacts 171-173 are fabricated respectively.

Further, a CVD or PVD process is performed to deposit a dielectric material (e.g., silicon oxide or silicon nitride) on the 3D array device 100, and the dielectric layer 121 becomes thicker. Openings for vias 174 are formed by a dry etch process or a combination of dry and wet etch processes. The openings may be subsequently filled with a conductive material such as W, Co, Cu, Al, or a combination thereof to form the vias 174, as shown in FIG. 12. CVD, PVD, ALD, electroplating, electroless plating, or a combination thereof may be performed. The vias 174 are connected to the contacts 171-173, the upper ends of corresponding NAND strings, and the plugs 162 of the array common source. Optionally, a layer of a conductive material (e.g., TiN) may be deposited first before filling the openings to form the vias 174.

Further, conductor layers 175 for interconnect may be grown by CVD, PVD, ALD, electroplating, electroless plating, or a combination thereof. The conductor layers 175 are deposited over and contact the vias 174, respectively, and include a conductive material such as W, Co, Cu, Al, or a combination thereof.

Similar to the formation of the vias 174, vias 176 are made over the conductor layers 175. For example, a dielectric material may be deposited to cover the conductor layers 175 and make the dielectric layer 121 thicker, openings for vias 176 may be formed, and the openings may be subsequently filled with a conductive material to form the vias 176.

Further, a CVD or PVD process is performed to deposit a dielectric material (e.g., silicon oxide or silicon nitride) to cover the vias 176 and thicken the dielectric layer 121 further. Openings are made and then filled to form connecting pads 177, 178, and 179 that serve as interconnects with a periphery device. As shown in FIG. 13, the connecting pads 177-179 are deposited over and contact the vias 176, respectively. As such, the connecting pads 177 are connected to the word line contacts 171, the upper ends of corresponding NAND strings, and the plugs 162, respectively. The connecting pads 178 and 179 are connected to the through silicon contacts 172 and 173, respectively. The connecting pads 177-179 may include a conductive material such as W, Co, Cu, Al, or a combination thereof. Optionally, a contact layer of a conductive material (e.g., TiN) may be deposited first before filling the openings to form the connecting pads 177-179.

Figure 14:
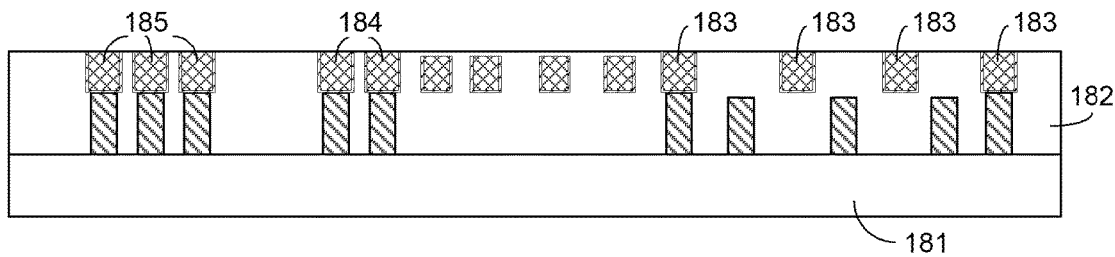
FIG. 14 illustrates a cross-sectional view of an exemplary periphery device according to various aspects of the present disclosure.

FIG. 14 shows a schematic cross-sectional view of a periphery device 180 according to aspects of the present disclosure. The periphery device 180 is a part of a memory device and may also be referred to as a peripheral structure. The periphery device 180 includes a substrate 181 that may include single crystalline silicon, Ge, SiGe, SiC, SOI, GOI, polysilicon, or a Group III-V compound such as GaAs or InP. Periphery CMOS circuits (e.g., control circuits) (not shown) are fabricated on the substrate 181 and used for facilitating the operation of the array device 100. For example, the periphery CMOS circuits may include metal-oxide-semiconductor field-effect transistors (MOSFETs) and provide functional devices such as page buffers, sense amplifiers, column decoders, and row decoders. A dielectric layer 182 is deposited over the substrate 181 and the CMOS circuits. Connecting pads (such as connecting pads 183, 184, and 185) and vias are formed in the dielectric layer 182. The dielectric layer 182 includes one or more dielectric materials such as silicon oxide and silicon nitride. The connecting pads 183-185 are configured as interconnects with the 3D array device 100 and may include a conductive material such as W, Co, Cu, Al, or a combination thereof.

For the 3D array device 100 and periphery device 180, the bottom side of the substrate 110 or 181 may be referred to as the back side, and the side with the connecting pads 177-179 or 183-185 may be referred to as the front side or face side.

Figure 15:
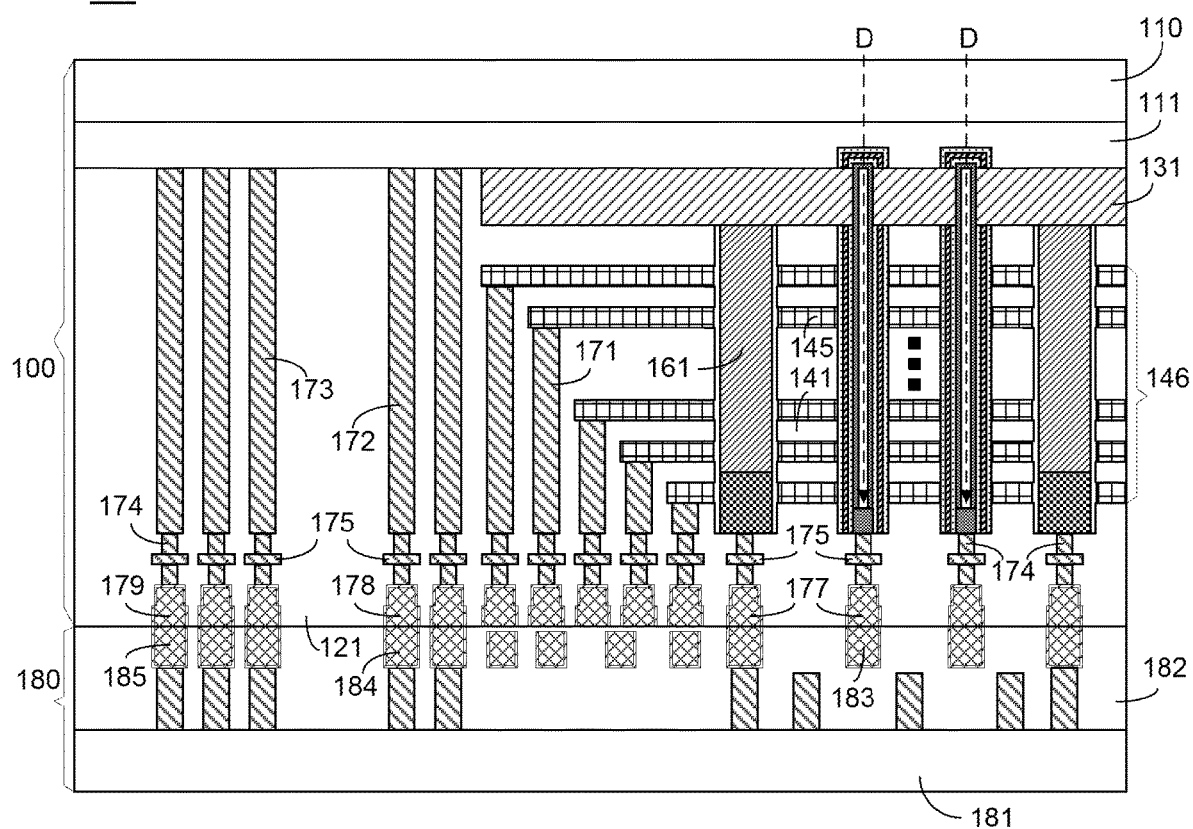
FIG. 15 illustrates a cross-sectional view of a 3D memory device after the 3D array device shown in FIG. 13 is bonded with the periphery device shown in FIG. 14 according to various aspects of the present disclosure.

FIG. 15 schematically shows a fabrication process of an exemplary 3D memory device 190 in a cross-sectional view according to aspects of the present disclosure. The 3D memory device 190 includes the 3D array device 100 shown in FIG. 13 and the periphery device 180 shown in FIG. 14.

The 3D array device 100 and periphery device 180 are bonded by a flip-chip bonding method to form the 3D memory device 190, as shown in FIG. 15. In some aspects, the 3D array device 100 is flipped vertically and becomes upside down with the top surfaces of the connecting pads 177-179 facing downward. The two devices are placed together such that the 3D array device 100 is above the periphery device 180. After an alignment is made, e.g., the connecting pads 177-179 are aligned with the connecting pads 183-185, respectively, the 3D array device 100 and periphery device 180 are joined face to face and bonded together. The conductor/insulator stack 146 and the periphery CMOS circuits become sandwiched between the substrates 110 and 181 or between the doped region 111 and the substrate 181. In some aspects, a solder or a conductive adhesive is used to bond the connecting pads 177-179 with the connecting pads 183-185, respectively. As such, the connecting pads 177-179 are connected to the connecting pads 183-185, respectively. The 3D array device 100 and periphery device 180 are in electrical communication after the flip-chip bonding process is completed.

Thereafter, other fabrication steps or processes are performed to complete fabrication of the 3D memory device 190. The other fabrication steps and processes are not reflected in FIG. 15 for simplicity. For example, from the bottom surface (after the flip-chip bonding), the substrate 110 of the 3D array device 100 is thinned by a thinning process, such as wafer grinding, dry etch, wet etch, CMP, or a combination thereof. A dielectric layer is grown over the doped region 111 by a deposition process (e.g., a CVD or PVD process). With similar methods as described above, vias and conductor layers are formed that connect the through silicon contacts 172 and 173, respectively. Further, a passivation layer is deposited and contact pads are formed that connect contacts 172 and/or 173. Further, additional fabrication steps or processes are performed. Details of the additional fabrication steps or processes are omitted for simplicity.

At a certain stage after the 3D array device 100 and the periphery device 180 are bonded together, passivation by deuterium may be performed. In some aspects, a deuterium gas or a mixture of a deuterium gas and an inert gas (e.g., a nitrogen gas or argon gas) may be used to transmit atomic deuterium to the 3D memory device 190. As shown exemplarily in FIG. 15, the deuterium gas reaches a surface of the device 100, and atomic deuterium diffuses into the NAND strings or regions of the memory cells via thermal diffusion. In the annealing process, atomic deuterium terminates certain defects in the device 100 (or device 190) by forming complexes with the defects.

Optionally, ion implantation of deuterium may be implemented to transmit atomic deuterium into the device 190. The implanted deuterium spreads in the NAND strings and other regions of the device in thermal diffusion, and cures certain defects.

In descriptions above, several methods are illustrated for passivation using atomic deuterium, such as those shown in FIGS. 5B, 9, and 15. In some aspects, one of the methods is performed to passivate defects of the device 100 or 190. Optionally, two or more of the methods may be performed separately to cure more defects and enhance the reliability of the device 190 further.

Figure 16:
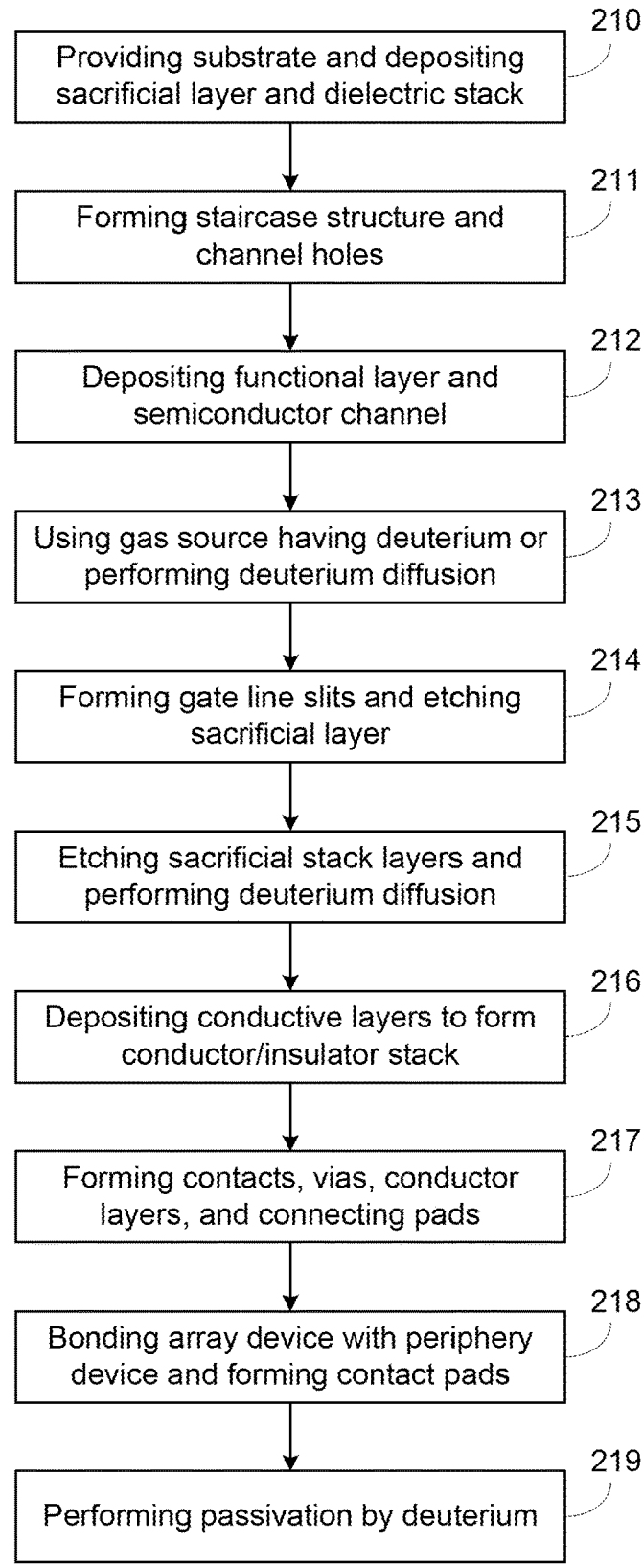
FIG. 16 illustrates a schematic flow chart of fabrication of a 3D memory device according to various aspects of the present disclosure.

FIG. 16 shows a schematic flow chart 200 for fabricating a 3D memory device according to aspects of the present disclosure. At 210, a substrate is provided for fabricating a 3D array device. A sacrificial layer is deposited over a top surface of the substrate for the 3D array device. The substrate includes a semiconductor substrate, such as a single crystalline silicon substrate. In some aspects, a cover layer is grown on the substrate before depositing the sacrificial layer. The cover layer includes a single layer or multiple layers that are grown sequentially over the substrate. For example, the cover layer may include silicon oxide, silicon nitride, and/or aluminum oxide. In some other aspects, the sacrificial layer may be deposited without first depositing the cover layer over the substrate. The sacrificial layer may include single crystalline silicon, polysilicon, silicon oxide, or silicon nitride.

Over the sacrificial layer, a dielectric stack of the 3D array device is fabricated. The dielectric stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer.

At 211, a staircase formation process is performed to convert a portion of the dielectric stack into a staircase structure. The staircase formation process includes multiple etches that are used to trim the portion of the dielectric stack into the staircase structure. A deposition process is performed to deposit a dielectric layer to cover the staircase structure. A part of the dielectric layer on a side of the staircase structure is used as a contact region where through silicon contacts for contact pads are configured. Further, channel holes are formed that extend through the dielectric stack and the sacrificial layer to expose portions of the substrate.

At 212, a functional layer is deposited on the sidewall and bottom surface of each channel hole. The functional layer includes a blocking layer, a charge trap layer, and a tunneling layer that are formed sequentially. Thereafter, a semiconductor channel is deposited on a surface of the tunneling layer.

At 213, two methods are presented schematically. Optionally, when the functional layer and semiconductor channel are grown, a gas source containing deuterium elements may be used. As such, complexes form in the functional layer and semiconductor channel and interfaces between the layers during fabrication. The complexes contain atomic deuterium that binds to a defect or defect state. As another option, passivation with deuterium may be performed to repair defects after the functional layer and semiconductor channel are formed and before the channel hole is filled completely. A deuterium gas or a mixture of a deuterium gas and an inert gas is provided. In an annealing process at elevated temperatures, the deuterium gas enters openings of the channel hole. Then, atomic deuterium is transmitted through the semiconductor channel and functional layer by thermal diffusion. Certain defects in the layers and interfaces are terminated after atomic deuterium binds to the defects to form complexes. Thereafter, the openings of the channel hole are filled with a dielectric material.

At 214, gate line slits of the 3D array device are formed. Along a direction vertical to the substrate, the gate line slits extend through the dielectric stack. After the gate line slits are etched, portions of the sacrificial layer are exposed. Thereafter, the sacrificial layer is etched away and a cavity is created above the substrate. The cavity exposes a bottom portion of the functional layer in the cavity. The cover layer is also exposed in the cavity, if it is deposited on the substrate. The layers of the functional layer exposed sequentially in the cavity, including the blocking layer, the charge trap layer, and the tunneling layer, are etched away, respectively. That is, the bottom portion of the functional layer that is close to the substrate is removed. The cover layer, if deposited, is also etched away during the process to etch the bottom portion of the functional layer or in another selective etch process. Hence, a potion of the substrate and portions of the semiconductor channel are exposed in the cavity.

Thereafter, a deposition process is performed to grow a semiconductor layer such as a polysilicon layer in the cavity. The semiconductor layer contacts the semiconductor channel and the substrate.

In some aspects, the dielectric stack includes two dielectric stack layers and one of the dielectric stack layers is sacrificial. The sacrificial stack layers are etched away at 215 to leave cavities in the dielectric stack. Portions of the functional layer (or the blocking layer) are exposed in the cavities. Optionally, a deuterium gas or a mixture of a deuterium gas and an inert gas is provided. In an annealing process at predetermined temperatures, the deuterium gas reaches the exposed portions of the blocking layer through openings of the gate line slit and the cavities, and atomic deuterium diffuses into the functional layer and semiconductor channel. After annealing, certain defects in the layers and interfaces are cured with atomic deuterium that binds to the defects to form complexes.

At 216, the cavities are filled with conductive materials to form conductive layers. The dielectric stack is transformed into a conductor/insulator stack.

Further, a dielectric layer is deposited on the side wall and bottom surface of the gate line slits. Portions of the dielectric layer on the bottom surfaces are etched out selectively to expose the semiconductor layer. Conductive materials, such as TiN, W, Cu, Al, and/or doped polysilicon are deposited in the gate line slits to form an array common source that contacts the semiconductor layer.

At 217, etching and deposition processes are performed to form word line contacts, through silicon contacts, vias, conductor layers, and connecting pads for the 3D array device. At 218, a flip-chip bonding process is performed to bond the 3D array device and a periphery device or fasten the 3D array device with a periphery device to create a 3D memory device. In some aspects, the 3D array device is flipped upside down and positioned above the periphery device. The connecting pads of the 3D array device and the periphery device are aligned and then bonded. After the substrate of the 3D array device is thinned, etching and deposition processes are performed to form vias, conductor layers, and contact pads over the through silicon contacts in the contact region of the 3D array device. The contact pads are configured for wire bonding for connection with other devices.

Optionally, at a certain stage after the 3D array device and periphery device are bonded to form the 3D memory device, passivation by deuterium may be performed. At 219, a deuterium gas or a mixture of a deuterium gas and an inert gas is arranged to create a deuterium gaseous environment for the passivation process. After the 3D memory device is placed in the deuterium gaseous environment at certain elevated temperature, atomic deuterium diffuses into regions of the NAND string. Then, certain defects in the NAND strings may be cured when atomic deuterium binds to the defects to form complexes.

Referring to the flow chart 200, in some aspects, a passivation process may also be performed by ion implantation of deuterium. The ion implantation of deuterium may be implemented at a certain stage of the fabrication process, such as after the semiconductor channel is formed, after the conductor/insulator stack is made, or after the periphery device is bonded. Optionally, ion implantation of deuterium may be performed multiple times. Ion implantation of deuterium may also be combined with other deuterium transmission mechanism illustrated above (e.g., using a deuterium gas) to repair defects.

Because complexes with atomic deuterium are more stable than complexes with atomic hydrogen, issues with charge leakage and threshold voltage shift may be improved. The reliability of the 3D NAND memory device may be enhanced.

Figure 17:
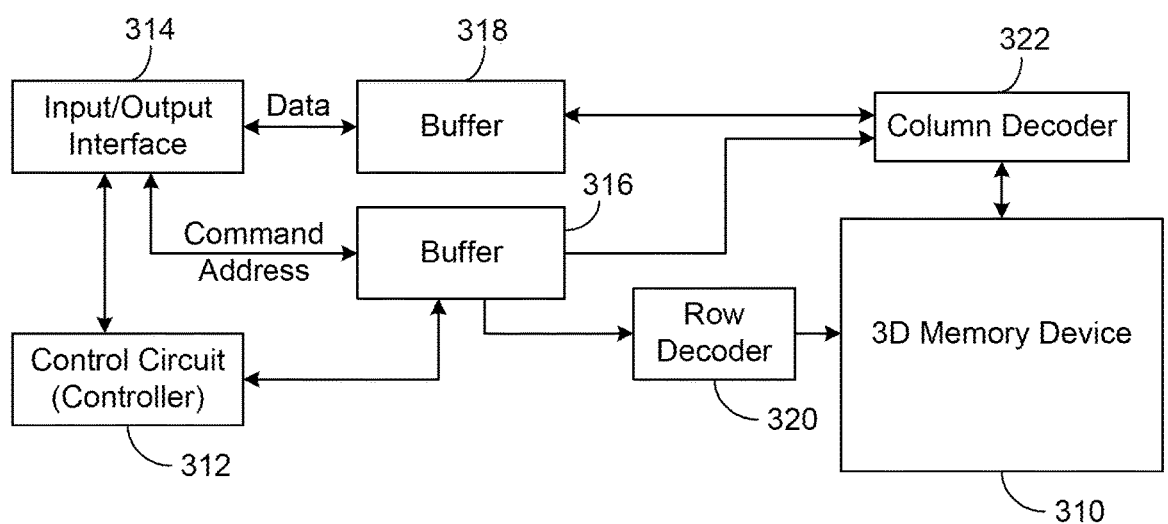
FIG. 17 illustrates a block diagram of a memory apparatus according to various embodiments of the present disclosure.

FIG. 17 shows a block diagram of a memory apparatus 300 according to embodiments of the present disclosure. Examples of the memory apparatus 300 may include data storage devices such as a solid-state drive (SSD), a universal flash storage (UFS) memory device, a multimedia card (MMC), an embedded multimedia card (eMMC), etc. The memory apparatus 300 may contain a 3D memory device such as the 3D memory device 190 illustrated above and shown in FIG. 15. As the 3D memory device 190 has improved reliability due to the reasons described above, when the device 190 is used, the memory apparatus 300 may have improved reliability, as well. As shown in FIG. 17, the memory apparatus 300 contains a 3D memory device 310 (e.g., the device 190) and a control circuit 312 that functions as a controller of the memory apparatus 300. The 3D memory device 310 may include one or more 3D memory arrays. The memory apparatus 300 further contains an input/output (I/O) interface 314, a buffer 316, a buffer 318, a row decoder 320, and a column decoder 322. The control circuit 312 implements various functions of the memory apparatus 300. For example, the control circuit 312 may implement read operations, write operations, and erase operations. The I/O interface 314, which may also be referred to as an I/O component or I/O connections, contains an I/O circuit to receive an input of command signals, address signals, and data signals to the memory apparatus 300 and transmit data and status information from the memory apparatus 300 to another device (e.g., a host device). The buffer 316 buffers or temporarily stores command/address signals, while the buffer 318 buffers or temporarily stores data signals. Optionally, the buffers 316 and 318 may be combined into a single buffering device. The row decoder 320 and column decoder 322 decode row and column address signals respectively for accessing the 3D memory device 310. The I/O interface 314 detects command signals, address signals, and data signals from the input. In some cases, the I/O interface 314 may transmit command and/or address signals to the buffer 316, and transmit data signals to the buffer 318. For simplicity, other components and functions of the memory apparatus 300 are omitted.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A method for fabricating a three-dimensional (3D) memory device, comprising:
 providing a substrate; and
 forming a stack structure over the substrate by forming a first dielectric layer and a second dielectric layer that are alternately stacked;
 forming a functional layer, the functional layer extending through the stack structure, and including a blocking layer, a charge trap layer, and a tunneling layer;
 forming a semiconductor channel on a surface of the functional layer,
 removing the second dielectric layer to form a cavity;
 transmitting deuterium elements to the functional layer through the cavity; and
 depositing a conductor layer in the cavity to form a conductor/insulator stack over the substrate; and
 forming a semiconductor layer between the substrate and the conductor/insulator stack, the semiconductor channel extending through the semiconductor layer;
 wherein at least one of the blocking layer, the charge trap layer, the tunneling layer- and the semiconductor channel includes a certain amount of the deuterium elements, and wherein the first dielectric layer of the conductor insulator stack also contains the deuterium elements between adjacent conductor layers of the conductor/insulator.

2. The method according to claim 1, wherein forming the functional layer comprises:
 forming a channel hole, the channel hole extending through the stack structure;
 forming the blocking layer on a sidewall of the channel hole;
 forming the charge trap layer on a surface of the blocking layer; and
 forming the tunneling layer on a surface of the charge trap layer.

3. The method according to claim 1, further comprising:
 transmitting the deuterium elements to the at least one of the blocking layer, the charge trap layer, the tunneling layer, and the semiconductor channel by ion implantation and/or diffusion.

4. A three-dimensional (3D) memory device, comprising:
 a substrate;
 a conductor/insulator stack, formed over the substrate;
 a semiconductor channel, extending through the conductor/insulator stack; and
 a semiconductor layer, formed between the substrate and the conductor/insulator stack, the semiconductor channel extending through the semiconductor layer; and
 a functional layer, extending through the conductor/insulator stack and formed between the semiconductor channel and the conductor/insulator stack, the functional layer including a blocking layer, a charge trap layer, and a tunneling layer,
 wherein at least one of the blocking layer, the charge trap layer, the tunneling layer, and the semiconductor channel includes a certain amount of deuterium elements, and wherein a dielectric layer of the conductor/insulator stack also contains the deuterium elements between adjacent conductor layers of the conductor/insulator.

5. The 3D memory device according to claim 4, wherein:
 the at least one of the blocking layer, the charge trap layer, the tunneling layer, and the semiconductor channel includes a complex that has a deuterium element.

6. The 3D memory device according to claim 4, wherein:
 the blocking layer, the charge trap layer, the tunneling layer, and the semiconductor channel each include a certain number of deuterium elements.

7. The 3D memory device according to claim 6, wherein:
 the blocking layer, the charge trap layer, the tunneling layer, and the semiconductor channel each include a complex that has a deuterium element.

8. The 3D memory device according to claim 4, wherein:
 the functional layer and the semiconductor channel do not include a complex that has a hydrogen element binding to a defect state.

9. The 3D memory device according to claim 4, further comprising:
 a gate line slit structure, extending through the conductor/insulator stack to separate a plurality of memory cells.

10. The 3D memory device according to claim 9, wherein:
 a portion of the dielectric layer proximate to the gate line slit structure with respect to the semiconductor channel includes a complex that contains the deuterium elements.

11. A memory apparatus, comprising:
 an input/output (I/O) component for receiving an input;
 a buffer for buffering a signal;
 a controller for implementing an operation; and
 a three-dimensional (3D) memory device, the 3D memory device comprising:
 a substrate;
 a conductor/insulator stack, formed over the substrate;
 a semiconductor channel, extending through the conductor/insulator stack; and
 a semiconductor layer, formed between the substrate and the conductor/insulator stack, the semiconductor channel extending through the semiconductor layer; and
 a functional layer, extending through the conductor/insulator stack and formed between the semiconductor channel and the conductor/insulator stack, the functional layer including a blocking layer, a charge trap layer, and a tunneling layer,
 wherein at least one of the blocking layer, the charge trap layer, the tunneling layer, and the semiconductor channel includes a certain amount of deuterium elements, and wherein a dielectric layer of the conductor/insulator stack also contains the deuterium elements between adjacent conductor layers of the conductor/insulator.

12. The 3D memory device according to claim 4, wherein:
 the conductor/insulator stack includes a staircase structure.

13. The 3D memory device according to claim 4, wherein:
the semiconductor layer that is formed between the substrate and the conductor/insulator stack is further directly connected to the semiconductor channel along a lateral direction.

14. The memory apparatus according to claim 11, wherein:
the at least one of the blocking layer, the charge trap layer, the tunneling layer, and the semiconductor channel includes a complex that contains the deuterium elements.

15. The memory apparatus according to claim 11, wherein:
the blocking layer, the charge trap layer, the tunneling layer, and the semiconductor channel each include the deuterium elements.

16. The memory apparatus according to claim 13, wherein:
the blocking layer, the charge trap layer, the tunneling layer, and the semiconductor channel each include a complex that contains the deuterium elements.

17. The memory apparatus according to claim 11, wherein:
the functional layer and the semiconductor channel do not include a complex that has a hydrogen element binding to a defect state.

18. The memory apparatus according to claim 11, further including:
a gate line slit structure, extending through the conductor/insulator stack to separate a plurality of memory cells.

19. The memory apparatus according to claim 18, wherein:
a portion of the dielectric layer of the conductor/insulator stack proximate to the gate line slit structure includes a complex that contains the deuterium elements.

20. The memory apparatus according to claim 11, wherein:
the semiconductor layer that is formed between the substrate and the conductor/insulator stack is further directly connected to the semiconductor channel along a lateral direction.

* * * * *